US012573459B2

(12) United States Patent
Sanuki et al.

(10) Patent No.: US 12,573,459 B2
(45) Date of Patent: Mar. 10, 2026

(54) SEMICONDUCTOR STORAGE DEVICE HAVING DEPLETION-TYPE MEMORY CELL TRANSISTORS

(71) Applicant: Kioxia Corporation, Tokyo (JP)

(72) Inventors: Tomoya Sanuki, Yokkaichi Mie (JP);
Keisuke Nakatsuka, Kobe Hyogo (JP)

(73) Assignee: Kioxia Corporation, Tokyo (JP)

( * ) Notice: Subject to any disclaimer, the term of this patent is extended or adjusted under 35 U.S.C. 154(b) by 226 days.

(21) Appl. No.: 18/177,115

(22) Filed: Mar. 2, 2023

(65) Prior Publication Data

US 2023/0410915 A1    Dec. 21, 2023

(30) Foreign Application Priority Data

Jun. 20, 2022    (JP) ................................. 2022-099173

(51) Int. Cl.
| | |
|---|---|
| *G11C 16/26* | (2006.01) |
| *G11C 11/56* | (2006.01) |
| *G11C 16/04* | (2006.01) |
| *G11C 16/10* | (2006.01) |
| *H10B 41/27* | (2023.01) |
| *H10B 43/27* | (2023.01) |

(52) U.S. Cl.
CPC .......... *G11C 16/26* (2013.01); *G11C 11/5628* (2013.01); *G11C 11/5642* (2013.01); *G11C 11/5671* (2013.01); *G11C 16/0483* (2013.01); *G11C 16/10* (2013.01); *H10B 41/27* (2023.02); *H10B 43/27* (2023.02)

(58) Field of Classification Search
None
See application file for complete search history.

(56) References Cited

U.S. PATENT DOCUMENTS

| | | | |
|---|---|---|---|
| 7,643,346 B2 | 1/2010 | Toriyama et al. | |
| 2005/0259467 A1 | 11/2005 | Forbes | |
| 2006/0044872 A1* | 3/2006 | Nazarian | G11C 16/0483 |
| | | | 365/185.17 |
| 2009/0010064 A1 | 1/2009 | Nazarian | |
| 2009/0059669 A1 | 3/2009 | Toriyama et al. | |
| 2011/0157978 A1 | 6/2011 | Shinozaki et al. | |
| 2012/0155168 A1 | 6/2012 | Kim et al. | |
| 2022/0180942 A1* | 6/2022 | Ikegami | G11C 16/26 |

FOREIGN PATENT DOCUMENTS

| | | |
|---|---|---|
| JP | 2014-086571 A | 5/2014 |

OTHER PUBLICATIONS

Yannis Tsidivis, "Operation and Modeling of the MOS transistor (2nd edition)" McGraw-Hill, 1999, p. 194.

* cited by examiner

*Primary Examiner* — Alfredo Bermudez Lozada
(74) *Attorney, Agent, or Firm* — Kim & Stewart LLP

(57) ABSTRACT

A semiconductor storage device has a bit line, a source line, a first memory cell and a second memory cell provided between the bit line and the source line and connected in series, a first word line connected to the first memory cell, a second word line connected to the second memory cell, and a control circuit. The control circuit, when executing a read operation with respect to the first memory cell, supplies a source voltage to the source line, supplies a first voltage to the first word line, and supplies a second voltage to the second word line, and a difference between the source voltage and the second voltage is smaller than a difference between the source voltage and the first voltage.

15 Claims, 10 Drawing Sheets

PRIOR ART

*FIG. 2*

PRIOR ART

PRIOR ART

PRIOR ART

PRIOR ART

SEMICONDUCTOR STORAGE DEVICE HAVING DEPLETION-TYPE MEMORY CELL TRANSISTORS

CROSS-REFERENCE TO RELATED APPLICATION

This application is based upon and claims the benefit of priority from Japanese Patent Application No. 2022-099173, filed Jun. 20, 2022, the entire contents of which are incorporated herein by reference.

FIELD

Embodiments described herein relate generally to a semiconductor storage device.

BACKGROUND

A memory system including a NAND type flash memory as a semiconductor storage device, and a controller that controls the NAND type flash memory, is known.

DESCRIPTION OF THE DRAWINGS

FIG. 2 is a block diagram for illustrating a configuration of the semiconductor storage device according to one embodiment.

DETAILED DESCRIPTION

Embodiments realize a reduction in energy consumed by a write operation and a read operation of a memory system.

In general, according to one embodiment, a semiconductor storage device includes a bit line, a source line, a first memory cell and a second memory cell provided between the bit line and the source line and connected in series, a first word line connected to the first memory cell, a second word line connected to the second memory cell, and a control circuit. The control circuit, when executing a read operation with respect to the first memory cell, supplies a source voltage to the source line, supplies a first voltage to the first word line, and supplies a second voltage to the second word line, and a difference between the source voltage and the second voltage is smaller than a difference between the source voltage and the first voltage.

Hereafter, a memory system including a semiconductor storage device according to embodiments will be specifically described, with reference to the drawings. In the following description, identical reference signs are allotted to components having approximately identical functions and configurations, and a duplicated description is given only when necessary. Each embodiment shown hereafter shows a device or a method for embodying a technical idea of this embodiment as an example. The technical idea of the embodiment is such that a material, a form, a structure, a disposition, or the like, of a component is not limited to those described hereafter. The technical idea of the embodiment may be such that various kinds of change are added to the scope of the patent claims.

1. First Embodiment

A memory system including a semiconductor storage device according to a first embodiment will be described, using FIGS. 1 to 8.

1-1. Memory System Overall Configuration

Figure 1:
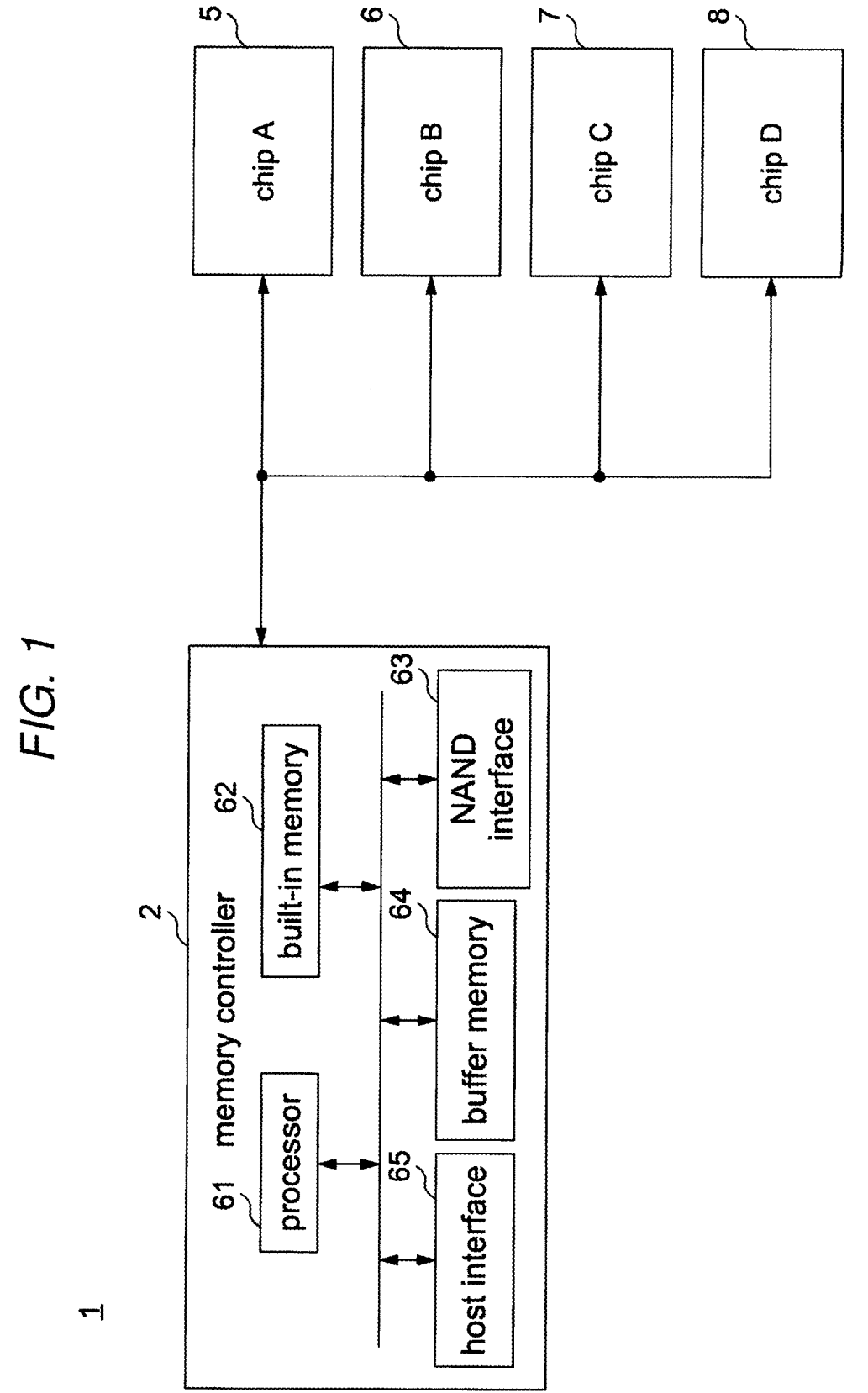
FIG. 1 is a block diagram for illustrating a configuration of a memory system including a semiconductor storage device according to one embodiment.

FIG. 1 is a block diagram for illustrating a configuration of a memory system 1 including a semiconductor storage device according to one embodiment. As shown in FIG. 1, the memory system 1 includes a memory controller 2 and semiconductor storage devices according to one embodiment, namely semiconductor storage devices 5 to 8. The memory controller 2 is connected to the semiconductor storage devices 5 to 8 by a bus. Non-volatile memory chips such as NAND flash memory chips are used as the semiconductor storage devices 5 to 8. The memory controller 2 controls operations of the semiconductor storage devices 5 to 8.

The memory controller 2 communicates with, for example, an unshown external host device. The memory controller 2 executes a write operation or a read operation with respect to the semiconductor storage devices 5 to 8 in accordance with a write request or a read request received from the host device. When a read operation is executed, the memory controller 2 transmits data stored in the semiconductor storage devices 5 to 8 to the host device.

The semiconductor storage devices 5 to 8 include a multiple of memory cells, and store data in a non-volatile way. The semiconductor storage devices 5 to 8 are semiconductor chips that are individually distinguishable. For example, the semiconductor storage devices 5 to 8 are distinguished by individual chip enable signals. Alternatively, the semiconductor storage devices 5 to 8 are distinguished by an individual chip address being assigned in advance to each semiconductor storage device. Consequently, the semiconductor storage devices 5 to 8 are independently controlled according to an instruction from the memory controller 2.

The memory controller 2 transmits various kinds of signal to the semiconductor storage devices 5 to 8, and receives various kinds of signal from the semiconductor storage devices 5 to 8, via the bus. The bus includes a multiple of signal lines, and carries out a transmission or a reception of a signal in accordance with an instruction transmitted from the memory controller 2. A signal transmitted or received via the bus is, for example, a chip enable signal, a command latch enable signal, an address latch enable signal, a write enable signal, a read enable signal, an output instruction signal, a write protect signal, a data signal (including a data strobe signal), or a ready/busy signal.

As shown in FIG. 1, the memory controller 2 includes a processor 61, a built-in memory 62, a NAND interface circuit 63 (NAND interface), a buffer memory 64, and a host interface circuit 65 (host interface).

The processor 61 is, for example, a central processing unit (CPU), and controls operations of the memory controller 2. The processor 61, for example, issues a write instruction to the semiconductor storage devices 5 to 8 via the NAND interface circuit 63 in response to a data write request received from an exterior (e.g., from a host device). The processor 61 operates in a similar manner for a read operation, a delete operation, a correction operation, and the like.

The built-in memory 62 is, for example, a semiconductor memory such as a random-access memory (RAM) or a dynamic RAM (DRAM), and is used as a workspace of the processor 61. The built-in memory 62 stores firmware for managing the semiconductor storage devices 5 to 8, various kinds of management table, and the like.

The NAND interface circuit 63 is connected to the semiconductor storage devices 5 to 8 via the aforementioned bus, and executes communication with the semiconductor storage devices 5 to 8. The NAND interface circuit 63 transmits a command, an address, or write data to the semiconductor storage devices 5 to 8 in accordance with an instruction from the processor 61. The NAND interface circuit 63 receives a status and read data from the semiconductor storage devices 5 to 8.

The buffer memory 64 temporarily stores data and the like received by the memory controller 2 from the semiconductor storage devices 5 to 8 or the exterior.

The host interface circuit 65 is connected to an external host device (not shown), and executes communication with the host device. The host interface circuit 65, for example, transfers an instruction and data received from the host device to the processor 61 and the buffer memory 64, respectively.

1-2. Semiconductor Storage Device Configuration

An example of a configuration of a semiconductor storage device according to the first embodiment will be described, using FIG. 2. The semiconductor storage devices 5 to 8 have, for example, equivalent configurations. Because of this, a configuration of the semiconductor storage device 5 of the semiconductor storage devices 5 to 8 will be described hereafter, and a description of configurations of the semiconductor storage devices 6 to 8 will be omitted.

Figure 2:
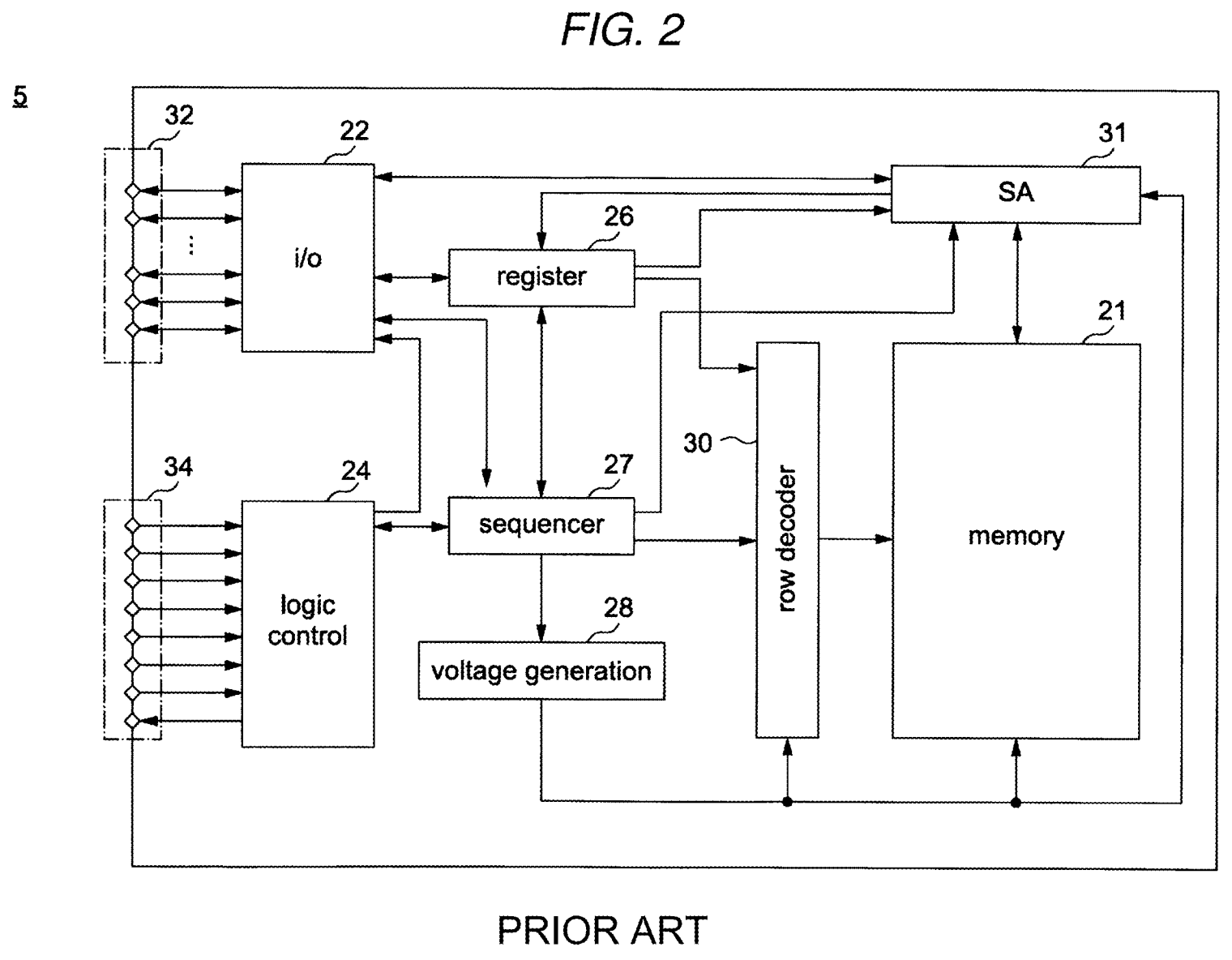

As shown in FIG. 2, the semiconductor storage device 5 includes a memory cell array 21 (memory), an input/output circuit 22 (i/o), a logic control circuit 24 (logic control), a register 26, a sequencer 27, a voltage generating circuit 28 (voltage generation), a row decoder 30, a sense amplifier 31 (SA), an input/output pad group 32, and a logic control pad group 34.

Although details will be described hereafter, the memory cell array 21 includes a multiple of non-volatile memory cells (not shown) correlated to a word line and a bit line.

The input/output circuit 22 carries out a transmission and reception of data to and from the memory controller 2. The input/output circuit 22 transfers a command and an address in a data signal to the register 26. The input/output circuit 22 carries out a transmission and reception of write data and read data to and from the sense amplifier 31.

The logic control circuit 24 receives, for example, a chip enable signal, a command latch enable signal, an address latch enable signal, a write enable signal, a read enable signal, an output instruction signal, or a write protect signal from the memory controller 2. The logic control circuit 24 transmits a ready/busy signal to the memory controller 2, thereby notifying the memory controller 2 of a state of the semiconductor storage device 5.

The register 26 stores a command and an address. The register 26 transfers an address to the row decoder 30 and the sense amplifier 31, and transfers a command to the sequencer 27. The sequencer 27 receives a command, and controls a whole of the semiconductor storage device 5 in accordance with a sequence based on the received command. The sequencer 27 is referred to herein as a "control circuit".

The voltage generating circuit 28 generates a voltage necessary for a data write operation, a read operation, a delete operation, or the like, based on an instruction from the sequencer 27. The voltage generating circuit 28 includes a multiple of drivers, and supplies a generated voltage to the row decoder 30 and the sense amplifier 31 in accordance with a control by the sequencer 27. The voltage generating circuit 28, for example, supplies a generated voltage to the relevant row decoder 30 based on a row address included in an indicated address.

The row decoder 30 selects a memory cell corresponding to a row address included in an indicated address, in accordance with a control by the sequencer 27. A voltage supplied from a driver set 29 via the row decoder 30 is applied to a selected row of memory cells.

When a data read operation is being carried out, the sense amplifier 31 detects read data read from a memory cell into a bit line, and transfers the detected read data to the input/output circuit 22. When a data write operation is being carried out, the sense amplifier 31 transfers write data written via a bit line to a memory cell. The sense amplifier 31 transfers data corresponding to a column address included in an indicated address to the input/output circuit 22, in accordance with a control by the sequencer 27.

The input/output pad group 32 transfers a data signal received from the memory controller 2 to the input/output circuit 22. The input/output pad group 32 transfers a data signal received from the input/output circuit 22 to the memory controller 2. The logic control pad group 34 transfers various kinds of signal received from the memory controller 2 to the logic control circuit 24.

1-3. Memory Cell Array Configuration

Figure 3:
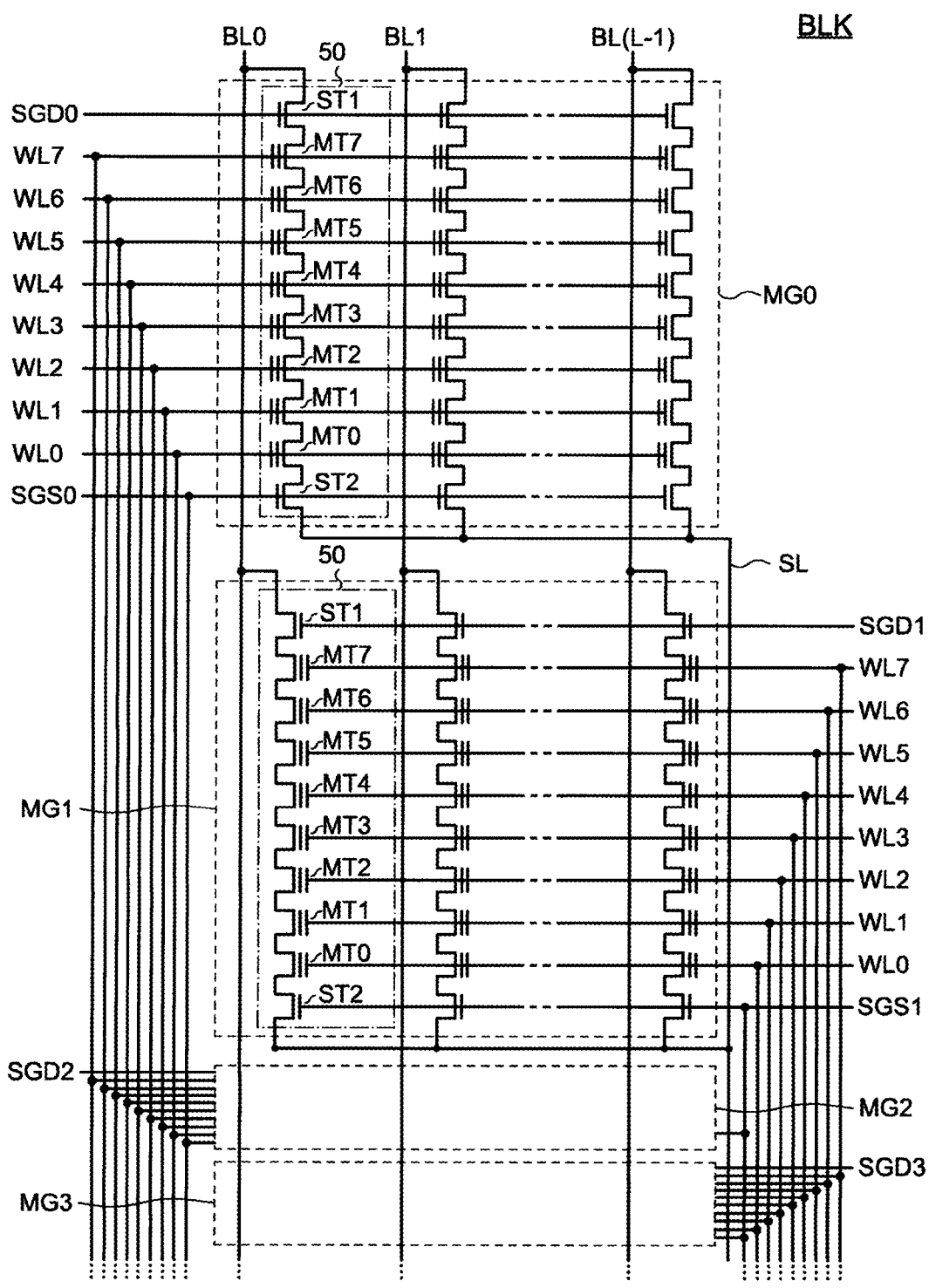
FIG. 3 is a diagram showing a circuit configuration of a memory cell array of the semiconductor storage device according to one embodiment.

A circuit configuration of the memory cell array 21 will be described, using FIG. 3. FIG. 3 is an equivalent circuit diagram of a block BLK. As shown, the block BLK includes a multiple of memory groups MG (MG0, MG1, MG2, and so on). The memory groups MG include a multiple of strings 50.

In the present embodiment, the string 50 includes eight memory cell transistors MT (MT0 to MT7) and select transistors ST (ST1 and ST2). The eight memory cell transistors MT are connected in series between a source of the select transistor ST1 and a drain of the select transistor ST2. In the present embodiment, a depletion-type transistor is used as the memory cell transistor MT and the select transistor ST. A depletion-type means that when a gate voltage (hereafter referred to as "a gate voltage with respect to a source voltage") is 0V in a case where a source voltage of a transistor is a reference, the transistor is in a conductive state (an on-state).

For example, a depletion- and n-type transistor is such that when 0V is supplied (applied) as the source voltage and 0V is supplied (applied) as the gate voltage, the transistor is in an on-state. When the gate voltage with respect to the source voltage is a negative voltage (equal to or less than a threshold voltage of the transistor), the depletion- and n-type transistor is in a non-conductive state (an off-state). For example, when 0V is supplied (applied) as the source voltage and −5V is supplied (applied) as the gate voltage (when the threshold voltage of the transistor is −5V or more), the transistor is in an off-state.

A depletion- and p-type transistor is such that when 0V is supplied (applied) as the source voltage and 0V is supplied (applied) as the gate voltage, the transistor is in an on-state, in the same way as the n-type transistor. Meanwhile, when the gate voltage with respect to the source voltage is a positive voltage (equal to or greater than a threshold voltage of the transistor), the depletion- and p-type transistor is in an off-state. For example, when 0V is supplied (applied) as the source voltage and 5V is supplied (applied) as the gate voltage (when the threshold voltage of the transistor is 5V or less), the transistor is in an off-state.

In the present embodiment, a configuration in which the number of memory cell transistors MT in the string 50 is eight is shown as an example, but this configuration is not limiting. For example, the number of memory cell transistors MT in the string 50 may be seven or less, or may be nine or more. Also, the number of select transistors ST is not limited by the heretofore described configuration either.

Although details will be described hereafter, the memory cell transistor MT includes a gate electrode GE, which controls an on-state and an off-state of the transistor, and a charge trapping layer CT, which stores a charge injected as a result of a write operation (refer to FIG. 5). The memory cell transistor MT has a threshold voltage that is in accordance with an amount of charge stored in a charge trapping layer, and attains an on-state when a voltage equal to or greater than the threshold voltage is applied to the gate electrode GE. When a write operation with respect to the memory cell transistor MT, that is, an injection of electrons into the charge trapping layer CT of the memory cell transistor MT, is carried out, the threshold voltage of the memory cell transistor MT changes. The threshold voltage of the memory cell transistor MT in a state in which electrons are injected into the charge trapping layer CT is higher than the threshold voltage of the memory cell transistor MT in a state in which no electrons are injected into the charge trapping layer CT. The memory cell transistor MT stores data in a non-volatile way as a result of the change in the threshold voltage caused by electrons being injected into the charge trapping layer CT.

A gate of the select transistor ST1 in the memory group MG is connected to a select gate line SGD (SGD0, SGD1, and so on). The select gate line SGD is independently controlled by the row decoder 30.

The gate electrodes GE of the memory cell transistors MT0 to MT7 in the same memory group MG and belonging to differing bit lines BL are connected to word lines WL0 to WL7 respectively. The word lines WL (WL0 to WL7) are independently controlled by the row decoder 30.

The block BLK is, for example, a data deletion unit. That is, data stored in the memory cell transistors MT in the same block BLK are deleted collectively. When a memory cell transistor is a depletion- and n-type transistor, the threshold voltage of the memory cell transistor MT in a state in which data are deleted (a deleted state) is lower than the threshold voltage of the memory cell transistor MT in a state in which data are written in (a written state).

Drains of the select transistors ST1 of the multiple of strings 50 provided in the same row in the memory cell array 21 are connected to a common bit line BL (BL0 to BL (L−1)) (L is a natural number equal to or greater than three). In the memory cell array 21, sources of the multiple of select transistors ST2 are connected to a common source line SL.

1-4. Memory Cell Array Sectional Structure

A certain sectional structure of the memory cell array 21 will be described, using FIG. 4. The memory cell array 21 includes wiring layers 10 to 12, a semiconductor substrate 13, a contact plug 16, a memory pillar MP, and the bit line BL.

Figure 4:
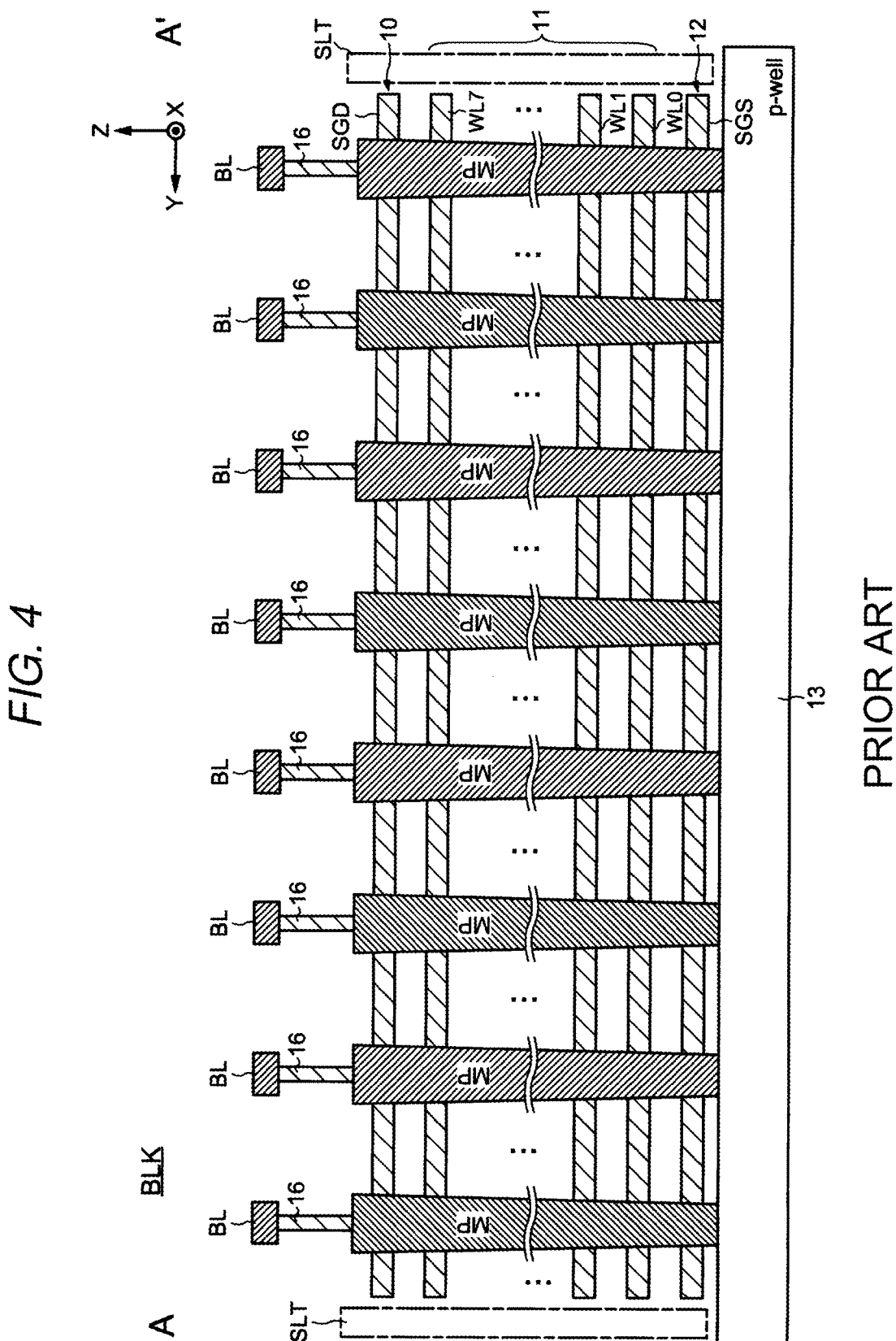
FIG. 4 is a sectional view of the semiconductor storage device according to one embodiment.

As shown in FIG. 4, the wiring layer 12, which functions as a select gate line SGS, is provided above the semiconductor substrate 13. Eight wiring layers 11, which function as the word lines WL0 to WL7, are provided above the wiring layer 12. The eight wiring layers 11 are stacked in a Z direction. The wiring layer 10, which functions as the select gate line SGD, is provided above the wiring layer 11.

Figure 5:
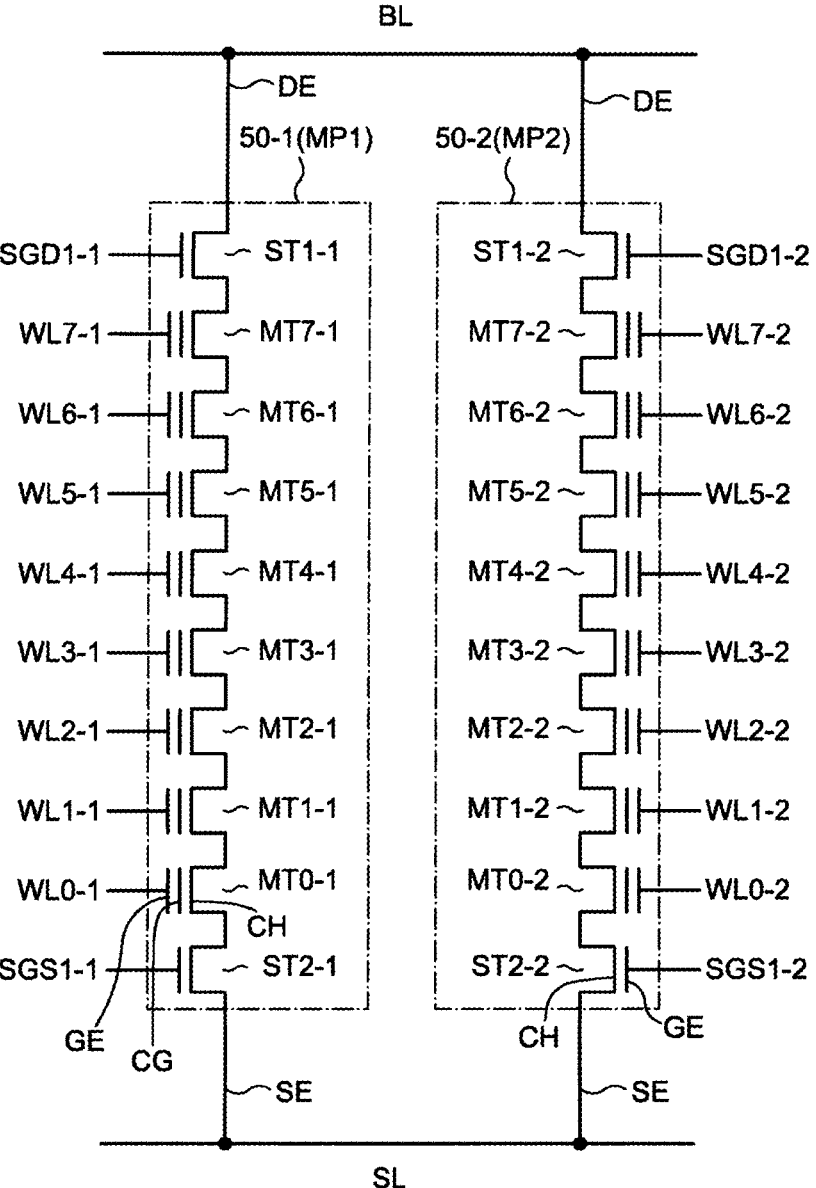
FIG. 5 is a diagram showing an equivalent circuit of neighboring strings in the semiconductor storage device according to one embodiment.

The memory pillar MP includes a semiconductor layer, the charge trapping layer CT, and the gate electrode GE (refer to FIG. 5). As the semiconductor layer functions as a transistor channel, the semiconductor layer is depicted a channel portion CH (refer to FIG. 5). The charge trapping layer CT is provided between the channel portion CH and the gate electrode GE, and opposes each of the channel portion CH and the gate electrode GE across an insulating layer. The gate electrode GE is connected to the word line WL. For example, monocrystalline or polycrystalline silicon is used as the semiconductor layer of the channel portion CH. It is noted that a material other than silicon may be used as the semiconductor layer. The semiconductor layer may also be amorphous, or may be a layer that is an amorphous and polycrystalline mixture.

A region of the semiconductor substrate 13 connected to the channel portion CH of the memory pillar MP may be referred to herein as a "source electrode SE". The contact plug 16 may be referred to herein as a "drain electrode DE" (refer to FIG. 5).

In a Y direction, the memory pillar MP is sandwiched by each of the wiring layer 10 (the select gate line SGD), the wiring layer 11 (the word line WL), and the wiring layer 12 (the select gate line SGS). The memory pillar MP is also sandwiched by these wiring lines in an X direction. That is, a periphery of the memory pillar MP is enclosed by the aforementioned wiring lines in an XY plane. It is noted that the present embodiment is not limited to this configuration, and it is sufficient that the wiring layers 10 to 12 oppose the memory pillar MP.

The select transistor ST1 is provided in a region in which the memory pillar MP opposes the select gate line SGD. The memory cell transistor MT is provided in a region in which the memory pillar MP opposes the word line WL. The select transistor ST2 is provided in a region in which the memory pillar MP opposes the select gate line SGS.

A slit SLT is provided between blocks BLK neighboring in the Y direction. An insulating layer is provided in the slit SLT. It is noted that a contact plug or the like for supplying (applying) voltage to a region provided inside the semiconductor substrate 13 may be provided inside the slit SLT. For example, a contact plug or a groove-form conductor for connecting a source of the select transistor ST2 to a source line may be provided inside the slit SLT.

The bit line BL is provided on the memory pillar MP. The contact plug 16, which connects the two, is provided between the memory pillar MP and the bit line BL.

1-5. Equivalent Circuit

FIG. 5 is a diagram showing an equivalent circuit of neighboring strings in a semiconductor storage device according to one embodiment. As shown in FIG. 5, one string 50 is provided in one memory pillar MP. In FIG. 5, two memory pillars MP1 and MP2 are shown. In the case of the memory cell transistors MT and the select transistors ST belonging to the memory pillar MP1, "–1" is appended after the reference sign, and in the case of the memory cell transistors MT and the select transistors ST belonging to the memory pillar MP2, "–2" is appended after the reference sign. In the following description, a description is given without appending "–1" or "–2" when there is no particular need to distinguish between the memory cell transistors MT and the select transistors ST belonging to the memory pillars MP1 and MP2.

The string 50 is provided between the bit line BL and the source line SL, and has the select transistor ST1, a quantity i (i is an integer of 2 or greater, 8 in the present embodiment) of memory cell transistors MT, and the select transistor ST2 connected in series. As i is 8 in the present embodiment, the memory cell transistors MT0 to MT7 are provided. The quantity i of memory cell transistors MT are connected in series between the select transistor ST1 and the select transistor ST2. The quantity i of memory cell transistors MT are disposed in the Z direction.

The memory cell transistor MT that is a target of a read operation among the quantity i of memory cell transistors MT may be referred to herein as a "first memory cell". The memory cell transistor MT that is not a target of a read operation may be referred to herein as a "second memory cell". For example, when the memory cell transistor MT3-1 is the target of a read operation, the memory cell transistor MT3-1 is the "first memory cell", and the other memory cell transistors MT0-1 to MT2-1 and MT4-1 to MT7-1 belonging to a string 50-1 are "second memory cells". The string 50 including the first memory cell that is the target of a read operation may be referred to herein as a "first memory string". The string 50 that does not include the first memory cell may be referred to herein as a "second memory string". In the heretofore described example, the string 50-1 is the "first memory string" and a string 50-2 is the "second memory string".

A multiple of memory cells are also provided in the second memory string. The select transistor ST1 in the first memory string may be referred to herein as a "first select transistor", and the select transistor ST2 may be referred to herein as a "second select transistor". In the same way, the select transistor ST1 in the second memory string may be referred to herein as a "third select transistor", and the select transistor ST2 may be referred to herein as a "fourth select transistor". In the heretofore described example, the select transistor ST1-1 is the "first select transistor", the select transistor ST2-1 is the "second select transistor", the select transistor ST1-2 is the "third select transistor", and the select transistor ST2-2 is the "fourth select transistor".

The source line SL is provided on a main face of the semiconductor substrate 13 (refer to FIG. 4). The source line SL may be of a configuration in which a non-patterned conductive layer spreads in a region of the memory cell array 21, or may be of a configuration in which a linearly patterned conductive layer spreads in the region. In other words, the source line SL spreads in the X direction and the Y direction. The source line SL may be formed of a conductive semiconductor in which one portion of the semiconductor substrate 13 has conductivity, or may be of a metal material formed on the semiconductor substrate 13.

Each of a quantity i (i is an integer of 2 or greater) of word lines WL is provided above (in the Z direction) the source line SL. The quantity i of word lines WL are in the same positions in the Z direction as the quantity i of memory cell transistors MT (refer to FIG. 4). That is, the positions of the i-th word line WL and the i-th memory cell transistor MT in the Z direction, with the source line SL as a reference, are the same. The word line WL connected to the first memory cell, of the quantity i of word lines WL, may be referred to herein as a "first word line", and the word line WL connected to the second memory cell may be referred to herein as a "second word line". In the heretofore described example, the word line WL3-1 is the "first word line", and the word lines WL0-1 to WL2-1 and WL4-1 to WL7-1 are the "second word lines".

The select transistor ST1 is connected to the select gate line SGD1. The select transistor ST2 is connected to the select gate line SGS1. The select gate line SGD1 connected to the first select transistor may be referred to herein as a "first gate line". The select gate line SGS1 connected to the second select transistor may be referred to herein as a "second gate line". The select gate line SGD1 connected to the third select transistor may be referred to herein as a "third gate line". The select gate line SGS1 connected to the fourth select transistor may be referred to herein as a "fourth gate line". In the heretofore described example, the select gate line SGD1-1 is the "first gate line", the select gate line SGS1-1 is the "second gate line", the select gate line SGD1-2 is the "third gate line", and the select gate line SGS1-3 is the "fourth gate line".

The strings 50-1 and 50-2 are connected to the same bit line BL and the same source line SL. The word lines WL0-1 to WL7-1 are controlled independently of the word lines WL0-2 to WL7-2. The select gate lines SGD1-1 and SGS1-1 are controlled independently of the select gate lines SGD1-2 and SGS1-2.

In FIG. 5, the memory cell transistor MT includes the channel portion CH, the charge trapping layer CT, and the gate electrode GE. The channel portion CH is a portion that functions as a channel of the memory cell transistor MT. The charge trapping layer CT stores a charge injected during a write operation. The threshold voltage of the memory cell transistor MT varies in accordance with an amount of charge stored in the charge trapping layer CT. The gate electrode GE is connected to the word line WL. The channel portion CH, the charge trapping layer CT, and the gate electrode GE are isolated from each other by insulating layers. The select transistor ST includes the channel portion CH and the gate electrode GE. The charge trapping layer CT is not provided in the select transistor ST. The charge trapping layer CT may be a floating gate, such as a metal layer, or may be a charge trapping layer, such as a silicon nitride layer. The write states below are determined in accordance with the amount of charge stored in the charge trapping layer CT. The memory cell transistor MT may also be a memory cell including a ferroelectric insulating layer. In this case, a ferroelectric insulating film is provided between the channel portion CH and the gate electrode GE, and the threshold voltage of the memory cell transistor MT changes as a result of a change in the permittivity. The string 50 is connected to the source line SL via the source electrode SE, and is connected to the bit line BL via the drain electrode DE.

1-6. Memory Cell Transistor Threshold Voltage Distribution

Figure 6:
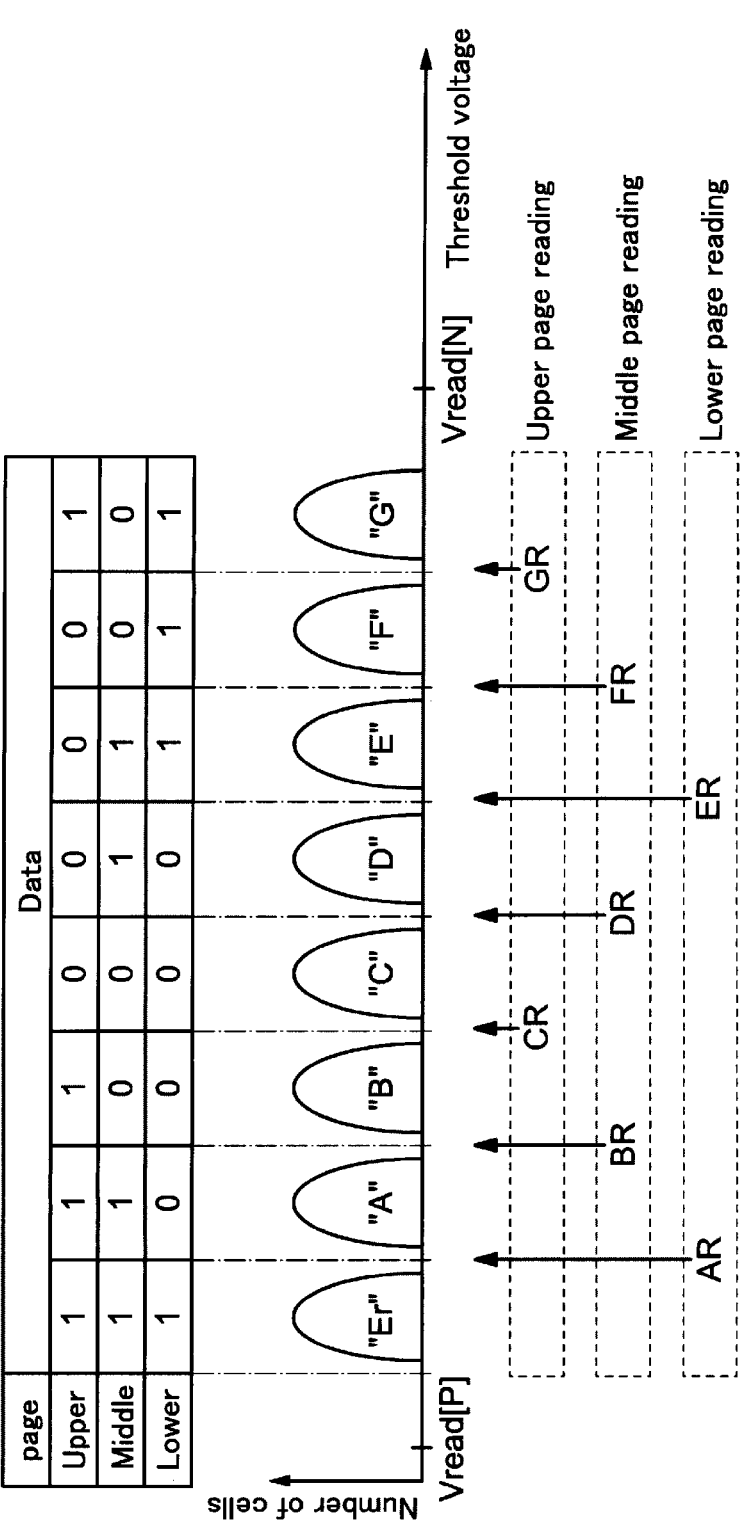
FIG. 6 is a diagram showing a threshold voltage distribution of a memory cell transistor in the semiconductor storage device according to one embodiment.

FIG. 6 is a diagram showing a threshold voltage distribution of a memory cell transistor used as a memory cell according to one embodiment. In FIG. 6, a triple-level cell (TLC) is illustrated as one example of threshold voltage distribution. It is noted that a quad-level cell (QLC), a multi-level cell (MLC), or a single-level cell (SLC) may also be used in the memory system 1.

FIG. 6 shows an example of each of a memory cell transistor threshold voltage distribution, a data assignment, and a read operation voltage. A vertical axis of the threshold voltage distribution corresponds to the number of memory cell transistors (the number of cells), and a horizontal axis corresponds to a threshold voltage Vth of the memory cell transistor.

The TLC type is such that a multiple of memory cell transistors include eight threshold voltage distributions. The eight threshold voltage distributions correspond to write states of the memory cells. The write states include, in order from the lowest threshold voltage, an "Er" state, an "A" state, a "B" state, a "C" state, a "D" state, an "E" state, an "F" state, and a "G" state. For example, the kinds of 3-bit data shown below, all differing from each other, are assigned to these write states. The 3-bit data include a lower bit (lower), a middle bit (middle), and an upper bit (upper).

In the present embodiment, the write states and the 3-bit data correspond as shown below.

"Er" state: "111" data
"A" state: "110" data
"B" state: "100" data
"C" state: "000" data
"D" state: "010" data
"E" state: "011" data
"F" state: "001" data
"G" state: "101" data The data above are shown in the order of upper, middle, lower.

A lower bit set stored in memory cell transistors connected to the same word line is referred to herein as a lower page, a middle bit set as a middle page, and an upper bit set as an upper page. A data write operation and read operation are carried out in the aforementioned page units.

A read voltage used in each read operation is set between neighboring threshold voltage distributions. For example, a read voltage AR that determines whether a memory cell transistor threshold voltage is included in the "Er" state or included in the "A" state or higher is set between a maximum threshold voltage of the "Er" state and a minimum threshold voltage of the "A" state.

Other read voltages BR, CR, DR, ER, FR, and GR are also set between neighboring states, in the same way as the read voltage AR. For example, the read voltage BR is set between the "A" state and the "B" state. The read voltage CR is set between the "B" state and the "C" state. The read voltage DR is set between the "C" state and the "D" state. The read voltage ER is set between the "D" state and the "E" state. The read voltage FR is set between the "E" state and the "F" state. The read voltage GR is set between the "F" state and the "G" state. The read voltages AR to GR, for example, may be set in stages as appropriate, in a range of −9V to −2V in a case of the n-type memory cell transistor MT, and in a range of 2V to 9V in a case of the p-type memory cell transistor MT.

When a read operation is carried out, a voltage Vread that compulsorily switches the memory cell transistor MT corresponding to an unselected word line WL to an on-state is supplied (applied) to the unselected word line WL. When the memory cell transistor MT is an n-type transistor, a voltage Vread (N) is set to a value higher than a maximum threshold voltage of the highest threshold voltage distribution (for example, the "G" state). When the memory cell transistor MT is a p-type transistor, a voltage Vread (P) is set to a value lower than a minimum threshold voltage of the lowest threshold voltage distribution (for example, the "Er" state). In either case, the memory cell transistor MT to whose gate Vread is applied is in an on-state, regardless of data stored.

When the aforementioned data assignment is applied, a read operation is such that one page of lower bit data (lower page data) is established in accordance with a result of a read using the read voltages AR and ER. One page of middle bit data (middle page data) is established in accordance with a result of a read using the read voltages BR, DR, and FR. One page of upper bit data (upper page data) is established in accordance with a result of a read using the read voltages CR and GR. As the lower page, middle page, and upper page data are established in accordance with two, three, and two read operations respectively in this way, this data assignment is known as a "2-3-2 code".

1-7. Read Operation

Figure 7:
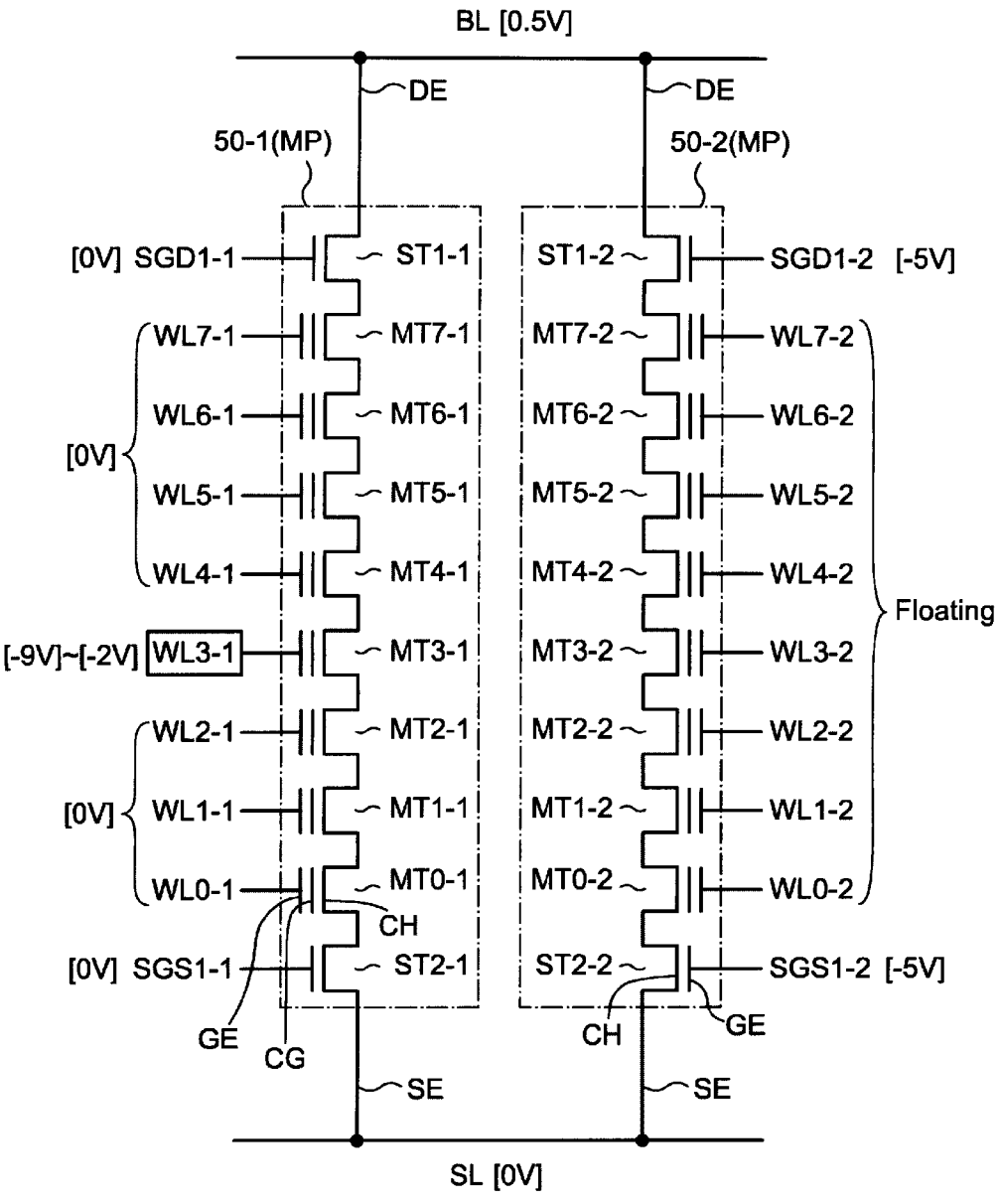
FIG. 7 is a diagram illustrating a read operation in the semiconductor storage device according to one embodiment.

A read operation with respect to the memory cell array 21 will be described, using FIG. 7. A configuration in which a monocrystalline silicon or a polycrystalline silicon into which an n-type dopant is injected is used as the channel portion CH of the memory pillar MP is illustrated in FIG. 7. An n-type dopant concentration of the channel portion CH is $1 \times 10^{18}$ cm$^{-3}$ or less. A dopant means an impurity that determines a polarity of a semiconductor. The n-type dopant is, for example, phosphorus or arsenic. That is, the n-type dopant concentration means a concentration of phosphorus or arsenic per unit volume in a semiconductor layer. In the present embodiment, a monocrystalline silicon or a polycrystalline silicon into which an n-type dopant is injected is used as the source electrode SE and the drain electrode DE. An n-type dopant concentration of the source electrode SE and the drain electrode DE is $1 \times 10^{20}$ cm$^{-3}$ or greater.

A case in which a read operation is executed with respect to the memory cell transistor MT3-1 in the string 50-1 is illustrated in FIG. 7. That is, in the present embodiment, the string 50-1 is the memory string that is a target of a read operation. The memory cell transistor MT3-1 is the memory cell that is a target of a read operation. The memory cell transistors MT0-1 to MT2-1 and MT4-1 to MT7-1 are the memory cells that are not a target of a read operation. The string 50-2 is the memory string that is not a target of a read operation.

As shown in FIG. 7, 0V is supplied (applied) as a source voltage to the source line SL. 0.5V is supplied (applied) as a bit voltage to the bit line BL. 0V is supplied (applied) as a first gate voltage to the select gate line SGD1-1, and 0V is supplied (applied) as a second gate voltage to the select gate line SGS1-1, whereby each of the select transistors ST1-1 and ST2-1 is controlled into an on-state. 0V (the voltage Vread) is supplied (applied) as a second voltage to the word lines WL0-1 to WL2-1 and WL4-1 to WL7-1, whereby the memory cell transistors MT0-1 to MT2-1 and MT4-1 to MT7-1 are controlled into an on-state, regardless of a write state thereof. In this state, −9V to −2V is supplied (applied) as a read voltage (refer to FIG. 6) to the memory cell transistor MT3-1, which is the target of a read operation.

As heretofore described, a read operation is such that a difference (0V) between the source voltage and the second voltage is smaller than a difference (−9V to −2V) between the source voltage and the first voltage. In the related art, an enhancement-type transistor is used as the memory cell transistor MT, and it is necessary to supply (apply) a high voltage, 9V for example, as the voltage Vread to the memory cell transistors that are not a target of a read operation. That is, in the related art, the difference between the source voltage and the second voltage is greater than the difference between the source voltage and the first voltage. As a result of this, a large amount of power is consumed during a read operation. By contrast, in the present disclosure, as heretofore described, the difference between the source voltage and the second voltage is smaller than the difference between the source voltage and the first voltage. As a result, power consumed during a read operation can be reduced.

In order to obtain the aforementioned advantage, the difference between the source voltage and the second voltage is preferably within 2V. In the present embodiment, the difference is zero, and a voltage equivalent to a ground (or a ground voltage (0V)) is supplied (applied) as the source voltage and the second voltage. A voltage equivalent to a ground (or a ground voltage) is a voltage supplied (applied) to, for example, the semiconductor substrate 13.

In the string 50-2, −5V is supplied (applied) as a third gate voltage to the select gate line SGD1-2, and −5V is supplied (applied) as a fourth gate voltage to the select gate line SGS1-2, whereby each of the select transistors ST1-2 and ST2-2 is controlled into an off-state. As heretofore described, the difference between the source voltage and the first gate voltage (0V) is smaller than the difference between the source voltage and the third gate voltage (5V). In the same way, the difference between the source voltage and the second gate voltage (0V) is smaller than the difference between the source voltage and the fourth gate voltage (5V). As no voltage is supplied (applied) to the word lines WL0-2 to WL7-2 belonging to the string 50-2, these word lines are in an electrically floating state.

The difference between the source voltage and the first gate voltage and the difference between the source voltage and the second gate voltage are preferably within 2V. In the present embodiment, these differences are zero, and a voltage equivalent to the ground (0V) is supplied (applied) as the source voltage, the first gate voltage, and the second gate voltage.

Figure 8:
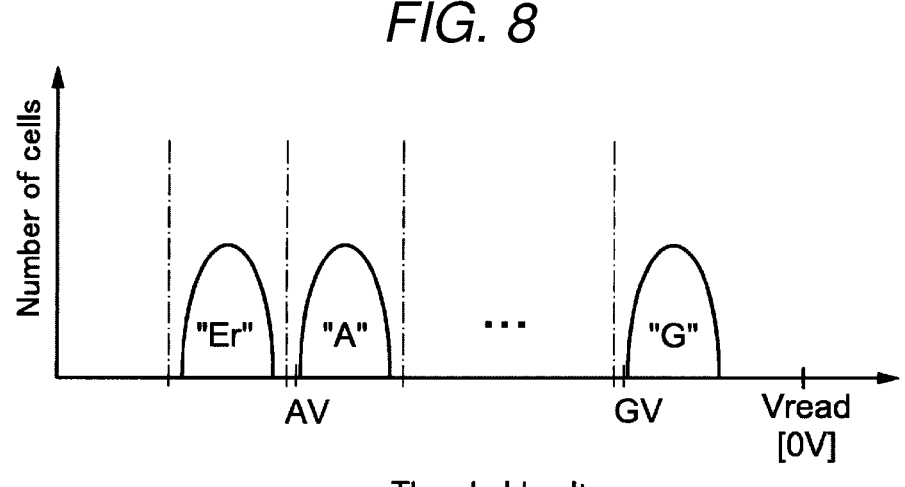
FIG. 8 is a diagram showing a threshold voltage distribution of a memory cell transistor in the semiconductor storage device according to one embodiment.

FIG. 8 is a diagram showing a threshold voltage distribution of a memory cell transistor according to one embodiment. As shown in FIG. 8, the memory cell transistor MT in the present embodiment is a depletion- and n-type transistor, and therefore has a write state in a voltage range smaller than 0V. Also, the voltage Vread in the present embodiment is 0V. Consequently, it can be said that the threshold voltage distribution that is the highest (the "G" state) among the multiple of write states available to the memory cell transistor MT is equal to or smaller than the source voltage. Furthermore, whichever state of the "Er" state to the "G" state the write state of the relevant memory cell transistor MT is at when a read operation is executed with respect to the memory cell transistor MT that is the target of the read operation, the word line WL connected to the memory cell transistor MT is at 0V or less.

2. Second Embodiment

Hereafter, a semiconductor storage device according to a second embodiment will be described. As a configuration and a read operation of the semiconductor storage device according to the second embodiment are the same as those of the semiconductor storage device according to the first embodiment, the semiconductor storage device according to the second embodiment will be described with reference to FIGS. 1 to 8. A description of configurations and operations the same as in the first embodiment will be omitted from the description of the present embodiment.

A configuration in which a monocrystalline silicon or a polycrystalline silicon into which a greater amount of an n-type dopant than in the first embodiment is injected is used as the channel portion CH of the memory pillar MP is described in the present embodiment. An n-type dopant concentration of the channel portion CH is $1 \times 10^{18}$ cm$^{-3}$ or greater and $1 \times 10^{20}$ cm$^{-3}$ or less. The dopant concentration being in the aforementioned range means that when a metal material is used as the source electrode SE and the drain electrode DE, as is the case hereafter, contact between the source electrode SE and drain electrode DE and the channel portion CH can be an ohmic contact.

A monocrystalline silicon or a polycrystalline silicon into which an n-type dopant is injected is used as the source electrode SE and the drain electrode DE. An n-type dopant concentration of the source electrode SE and the drain electrode DE is $1 \times 10^{20}$ cm$^{-3}$ or greater. Alternatively, a metal material such as tungsten or titanium nitride may be used as the source electrode SE and the drain electrode DE.

As heretofore described, the same advantages as with the semiconductor storage device 1 according to the first embodiment can be obtained using the semiconductor storage device 1 according to the second embodiment.

3. Third Embodiment

A semiconductor storage device according to a third embodiment will be described, using FIGS. 9 and 10. As a configuration of the semiconductor storage device according to the third embodiment is the same as that of the semiconductor storage device according to the first embodiment except the polarity of the channel portion CH, the semiconductor storage device according to the third embodiment will be described with reference to FIGS. 1 to 6. A description of configurations and operations the same as in the first embodiment will be omitted from the description of the present embodiment.

In the present embodiment, in the same way as in the first embodiment and the second embodiment, a depletion-type transistor is used as the memory cell transistor MT and the select transistor ST. In contrast to the first embodiment and the second embodiment, a p-type transistor is used as the aforementioned transistor.

3-1. Read Operation

A read operation with respect to the memory cell array 21 will be described, using FIG. 9. A configuration in which a monocrystalline silicon or a polycrystalline silicon into which a p-type dopant is injected is used as the channel portion CH of the memory pillar MP is illustrated in FIG. 9. A p-type dopant concentration of the channel portion CH is $1 \times 10^{18}$ cm$^{-3}$ or greater and $1 \times 10^{20}$ cm$^{-3}$ or less. The p-type dopant is, for example, boron. That is, the p-type dopant concentration means a concentration of boron per unit volume in a semiconductor layer. In the present embodiment, a monocrystalline silicon or a polycrystalline silicon into which a p-type dopant is injected is used as the source electrode SE and the drain electrode DE. A p-type dopant concentration of the source electrode SE and the drain electrode DE is $1 \times 10^{20}$ cm$^{-3}$ or greater. Also, a metal material such as tungsten or titanium nitride may also be used as the source electrode SE and the drain electrode DE.

Figure 9:
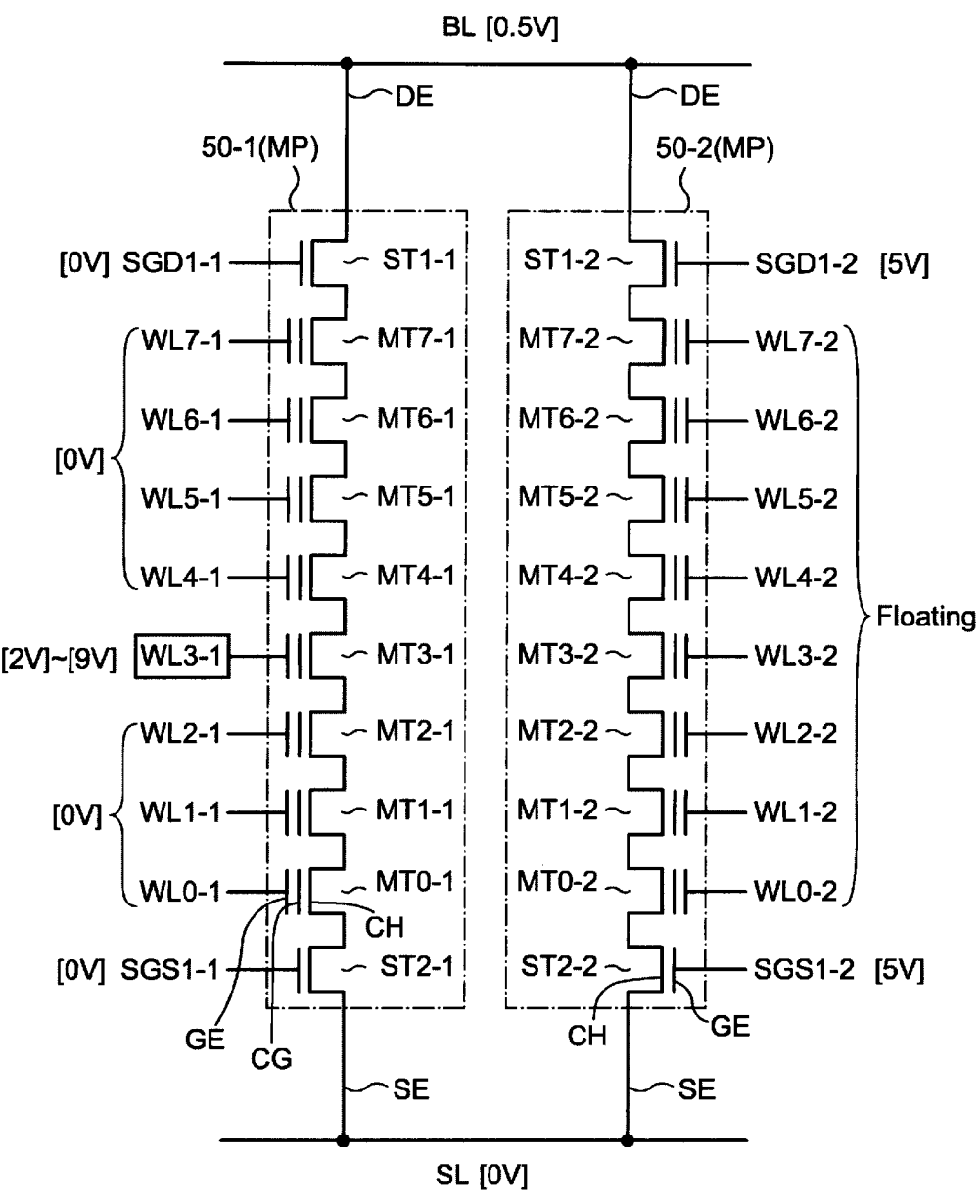
FIG. 9 is a diagram illustrating a read operation in a semiconductor storage device according to another embodiment.

A case in which a read operation is executed with respect to the memory cell transistor MT3-1 in the string 50-1 is illustrated in FIG. 9. That is, in the present embodiment, the string 50-1 is the memory string that is a target of a read operation. The memory cell transistor MT3-1 is the memory cell that is a target of a read operation. The memory cell transistors MT0-1 to MT2-1 and MT4-1 to MT7-1 are the memory cells that are not a target of a read operation. The string 50-2 is the memory string that is not a target of a read operation.

As shown in FIG. 9, 0V is supplied (applied) as a source voltage to the source line SL. 0.5V is supplied (applied) as a bit voltage to the bit line BL. 0V is supplied (applied) as a first gate voltage to the select gate line SGD1-1, and 0V is supplied (applied) as a second gate voltage to the select gate line SGS1-1, whereby each of the select transistors ST1-1 and ST2-1 is controlled into an on-state. 0V (the voltage Vread) is supplied (applied) as a second voltage to the word lines WL0-1 to WL2-1 and WL4-1 to WL7-1, whereby the memory cell transistors MT0-1 to MT2-1 and MT4-1 to MT7-1 are controlled into an on-state, regardless of a write state thereof. In this state, 2V to 9V is supplied (applied) as a read voltage (refer to FIG. 6) to the memory cell transistor MT3-1, which is the target of a read operation.

In order to obtain the same advantage as in the first embodiment and the second embodiment, the difference between the source voltage and the second voltage is preferably within 2V. In the present embodiment, the difference is zero, and a voltage equivalent to the ground (0V) is supplied (applied) as the source voltage and the second voltage.

In the string 50-2, 5V is supplied (applied) as a third gate voltage to the select gate line SGD1-2, and 5V is supplied (applied) as a fourth gate voltage to the select gate line SGS1-2, whereby each of the select transistors ST1-2 and ST2-2 is controlled into an off-state. As heretofore described, the difference between the source voltage and the first gate voltage (0V) is smaller than the difference between the source voltage and the third gate voltage (5V). In the same way, the difference between the source voltage and the second gate voltage (0V) is smaller than the difference between the source voltage and the fourth gate voltage (5V). As no voltage is supplied (applied) to the word lines WL0-2 to WL7-2 belonging to the string 50-2, these word lines are in an electrically floating state.

The difference between the source voltage and the first gate voltage and the difference between the source voltage and the second gate voltage are preferably within 2V. In the present embodiment, the differences are zero, and a voltage equivalent to the ground (0V) is supplied (applied) as the source voltage, the first gate voltage, and the second gate voltage.

Figure 10:
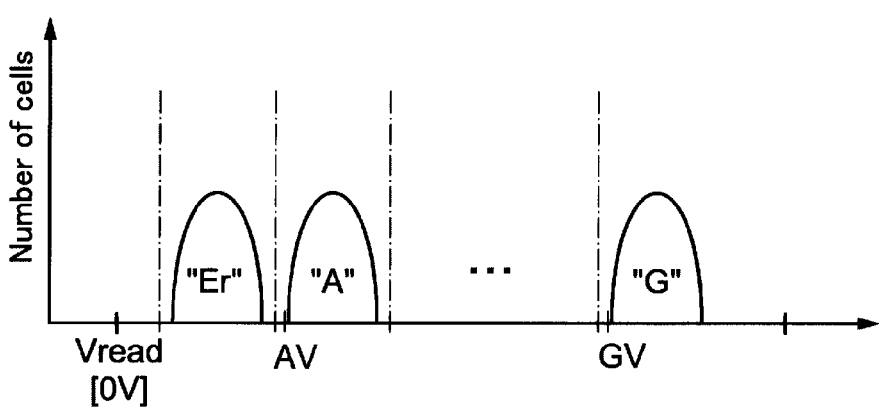
FIG. 10 is a diagram showing a threshold voltage distribution of a memory cell transistor in the semiconductor storage device according to another embodiment.

FIG. 10 is a diagram showing a threshold voltage distribution of a memory cell transistor according to one embodiment. As shown in FIG. 10, the memory cell transistor MT in the present embodiment is a depletion- and p-type transistor, and therefore has a write state in a voltage range greater than 0V. Also, the voltage Vread in the present embodiment is 0V. Consequently, it can be said that the threshold voltage distribution that is the lowest (the "Er" state) among the multiple of write states available to the memory cell transistor MT is equal to or greater than the source voltage. Furthermore, whichever state of the "Er" state to the "G" state the write state of the relevant memory cell transistor MT is at when a read operation is executed with respect to the memory cell transistor MT that is the target of the read operation, the word line WL connected to the memory cell transistor MT is at 0V or greater.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a bit line;
a source line;
a first memory cell and a second memory cell provided between the bit line and the source line and connected in series, wherein each of the first memory cell and the second memory cell has a polarity of an n-type transistor and includes a channel portion including a monocrystalline silicon or a polycrystalline silicon, a source electrode, and a drain electrode, and a concentration of an n-type impurity in the channel portion is $1\times10^{18}$ cm$^{-3}$ or less;
a first word line connected to the first memory cell;
a second word line connected to the second memory cell; and
a control circuit, wherein
the first memory cell and the second memory cell are depletion-type memory cell transistors, and
the control circuit is configured to, when executing a read operation with respect to the first memory cell,
supply a source voltage to the source line,
supply a first voltage to the first word line, and
supply a second voltage to the second word line, and
a difference between the source voltage and the second voltage is smaller than a difference between the source voltage and the first voltage.

2. The semiconductor storage device according to claim 1, wherein the difference between the source voltage and the second voltage is less than 2 V.

3. The semiconductor storage device according to claim 1, wherein a voltage equivalent to a ground voltage is supplied as the source voltage and the second voltage.

4. The semiconductor storage device according to claim 1, further comprising:
a first memory string, provided between the bit line and the source line, that includes a first select transistor, which is connected between the bit line and the first and second memory cells, and a second select transistor connected between the first and second memory cells and the source line;
a first gate line connected to the first select transistor;
a second gate line connected to the second select transistor;
a second memory string, provided between the bit line and the source line, that includes a third select transistor, which is connected between the bit line and multiple memory cells, and a fourth select transistor connected between the multiple memory cells and the source line;
a third gate line connected to the third select transistor; and
a fourth gate line connected to the fourth select transistor, wherein
the control circuit, when executing the read operation with respect to the first memory cell,
supplies a first gate voltage to the first gate line,
supplies a second gate voltage to the second gate line,
supplies a third gate voltage to the third gate line, and
supplies a fourth gate voltage to the fourth gate line,
a difference between the source voltage and the first gate voltage is smaller than a difference between the source voltage and the third gate voltage, and

a difference between the source voltage and the second gate voltage is smaller than a difference between the source voltage and the fourth gate voltage.

5. The semiconductor storage device according to claim 4, wherein the difference between the source voltage and the first gate voltage and the difference between the source voltage and the second gate voltage are each less than 2 V.

6. The semiconductor storage device according to claim 4, wherein a voltage equivalent to a ground voltage is supplied as the source voltage, the first gate voltage, and the second gate voltage.

7. The semiconductor storage device according to claim 1, wherein the control circuit is configured to program the first memory cell or the second memory cell to one of a plurality of write states, each corresponding to one of a plurality of threshold voltage distributions, and the plurality of threshold voltage distributions have voltages that are each equal to or smaller than the source voltage.

8. The semiconductor storage device according to claim 7, wherein when the control circuit executes the read operation with respect to the first memory cell, the first voltage is 0 V or less.

9. The semiconductor storage device according to claim 1, wherein each of the first memory cell and the second memory cell includes a floating gate or a charge trapping layer, and the control circuit is configured to program the first memory cell or the second memory cell to one of a plurality of write states, each corresponding to one of a plurality of threshold voltage distributions, that differ in accordance with an amount of charge stored in the floating gate or the charge trapping layer thereof.

10. The semiconductor storage device according to claim 1, wherein each of the first memory cell and the second memory cell is a memory cell including a ferroelectric insulating layer, and the control circuit is configured to program the first memory cell or the second memory cell to one of a plurality of write states, each corresponding to one of a plurality of threshold voltage distributions.

11. The semiconductor storage device according to claim 1, wherein the control circuit is configured to program the first and second memory cells to one of a plurality of write states in response to an instruction from an external controller, wherein the plurality of threshold voltage distributions include a first threshold voltage distribution corresponding to one of the write states and a second threshold voltage distribution corresponding to another one of the write states, and all voltages of the first threshold voltage distributions are less than 0 V.

12. A semiconductor storage device comprising:

a bit line;

a source line;

a first memory cell and a second memory cell provided between the bit line and the source line and connected in series, wherein each of the first memory cell and the second memory cell has a polarity of an n-type transistor, and includes a channel portion including a monocrystalline silicon or a polycrystalline silicon having $1\times10^{18}$ cm$^{-3}$ or greater and $1\times10^{20}$ cm$^{-3}$ or less of phosphorus or arsenic, and source and drain electrodes that include a monocrystalline silicon or a polycrystalline silicon having $1\times10^{20}$ cm$^{-3}$ or greater of phosphorus or arsenic;

a first word line connected to the first memory cell;

a second word line connected to the second memory cell; and a control circuit, wherein the first memory cell and the second memory cell are depletion-type memory cell transistors, and the control circuit is configured to, when executing a read operation with respect to the first memory cell, supply a source voltage to the source line, supply a first voltage to the first word line, and supply a second voltage to the second word line, and a difference between the source voltage and the second voltage is smaller than a difference between the source voltage and the first voltage.

13. A semiconductor storage device comprising:

a bit line;

a source line;

a first memory cell and a second memory cell provided between the bit line and the source line and connected in series, wherein each of the first memory cell and the second memory cell has a polarity of a p-type transistor, and includes a channel portion including a monocrystalline silicon or a polycrystalline silicon having $1\times10^{18}$ cm$^{-3}$ or greater and $1\times10^{20}$ cm$^{-3}$ or less of boron, and source and drain electrodes that include a monocrystalline silicon or a polycrystalline silicon having $1\times10^{20}$ cm$^{-3}$ or greater of boron;

a first word line connected to the first memory cell;

a second word line connected to the second memory cell; and a control circuit, wherein the first memory cell and the second memory cell are depletion-type memory cell transistors, and the control circuit is configured to, when executing a read operation with respect to the first memory cell, supply a source voltage to the source line, supply a first voltage to the first word line, and supply a second voltage to the second word line, and a difference between the source voltage and the second voltage is smaller than a difference between the source voltage and the first voltage.

14. The semiconductor storage device according to claim 13, wherein the control circuit is configured to program the first memory cell or the second memory cell to one of a plurality of write states, each corresponding to one of a plurality of threshold voltage distributions, and the plurality of threshold voltage distributions have voltages that are each equal to or greater than the source voltage.

15. The semiconductor storage device according to claim 14, wherein when the control circuit executes the read operation with respect to the first memory cell, the first voltage is 0 V or greater.

\* \* \* \* \*